(12) United States Patent
Drzaic et al.

(10) Patent No.: US 10,705,634 B1
(45) Date of Patent: Jul. 7, 2020

(54) FOLDABLE ELECTRONIC DEVICE WITH EXPOSED DISPLAY REGION

(71) Applicant: Apple Inc., Cupertino, CA (US)

(72) Inventors: Paul S. Drzaic, Morgan Hill, CA (US); Hoon Sik Kim, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/967,392

(22) Filed: Apr. 30, 2018

Related U.S. Application Data

(60) Provisional application No. 62/537,242, filed on Jul. 26, 2017.

(51) Int. Cl.
| | | |
|---|---|---|
| *G06F 3/041* | (2006.01) | |
| *H05K 1/02* | (2006.01) | |
| *G06F 1/16* | (2006.01) | |
| *H04R 1/02* | (2006.01) | |
| *G01J 1/42* | (2006.01) | |
| *G06F 3/0481* | (2013.01) | |
| *G06F 3/0488* | (2013.01) | |

(52) U.S. Cl.
CPC .......... *G06F 3/0412* (2013.01); *G01J 1/4204* (2013.01); *G06F 1/1605* (2013.01); *G06F 3/0488* (2013.01); *G06F 3/04817* (2013.01); *H04R 1/025* (2013.01); *H05K 1/028* (2013.01); *H05K 2201/10083* (2013.01)

(58) Field of Classification Search
CPC .. G06F 3/0412; G06F 3/04817; G06F 3/0488; G01J 1/4204; H04R 1/025; H05K 1/028
See application file for complete search history.

(56) References Cited

U.S. PATENT DOCUMENTS

| | | | |
|---|---|---|---|
| 9,560,189 | B2 | 1/2017 | Lee et al. |
| 2014/0210706 | A1* | 7/2014 | Park ...................... G06F 3/0487 345/156 |
| 2016/0070304 | A1 | 3/2016 | Shin et al. |
| 2016/0147362 | A1* | 5/2016 | Eim ...................... G06F 1/1641 345/173 |
| 2016/0212840 | A1 | 7/2016 | Koo et al. |
| 2017/0142848 | A1* | 5/2017 | Yeo ........................ H05K 1/028 |

* cited by examiner

*Primary Examiner* — Lisa S Landis
(74) *Attorney, Agent, or Firm* — Treyz Law Group, P.C.; G. Victor Treyz; Kendall W. Abbasi

(57) ABSTRACT

An electronic device may be provided with a display mounted in a housing. The display is flexible and bends around a bend axis as the housing is folded and unfolded. When the housing is in an unfolded configuration, the display lies flat in a plane and displays images for a user. When the housing is folded along the bend axis and placed into a folded configuration, a first portion of the display is covered by the housing and is hidden from view, whereas a protruding second portion of the display is uncovered by the housing and exposed for viewing. Control circuitry in the device may display notifications, icons, and other content on the exposed second portion.

19 Claims, 15 Drawing Sheets

FOLDABLE ELECTRONIC DEVICE WITH EXPOSED DISPLAY REGION

This application claims the benefit of provisional patent application No. 62/537,242, filed Jul. 26, 2017, which is hereby incorporated by reference herein in its entirety.

FIELD

This relates to electronic devices, and, more particularly, to electronic devices with displays.

BACKGROUND

Electronic devices such as laptop computers, cellular telephones, and other equipment may include displays. To enhance portability, devices may be provided with the ability to fold. A foldable device may be placed in an unfolded configuration to expand the size of the device and thereby facilitate user interaction with the device. When it is desired to enhance portability, the foldable device may be placed in a folded configuration.

If care is not taken, foldable devices may be inconvenient to use. For example, device functions may be inaccessible to a user when a foldable device is in its folded configuration.

SUMMARY

An electronic device may be provided with a display mounted in a housing. The display may have an array of pixels that form an active area for displaying images. The array of pixels may be formed from on a flexible substrate so that the display is flexible and bends around a bend axis as the housing is folded and unfolded.

When the housing is in an unfolded configuration, the display lies flat and displays images for a user. When the housing is folded along the bend axis and placed into a folded configuration, a first portion of the display is covered by the housing and is hidden from view, while a protruding second portion of the display that lies in the same plane as the first portion is uncovered by the housing and exposed for viewing. In some configurations, the second portion extends down a sidewall of the housing and remains viewable at the end of the device when the housing is in the folded configuration.

Control circuitry in the device may display images for the user on the display when the housing is in the unfolded configuration. When the housing is in the folded configuration and the first portion of the display is hidden from view, display notifications, icons, and other content may be displayed on the exposed second portion.

DETAILED DESCRIPTION

Electronic devices can be provided with displays. The displays may, if desired, be flexible displays having one or more bendable portions. This allows the electronic devices to be folded. As an example, two halves of an electronic device housing may be folded and rotated with respect to each other about a bend axis (folding axis). A flexible display in the electronic device may have a bendable portion that overlaps the bend axis. In this type of arrangement, the electronic device may be used in a folded configuration in which portability is enhanced and an unfolded configuration in which the display is unfolded for use.

Figure 1:
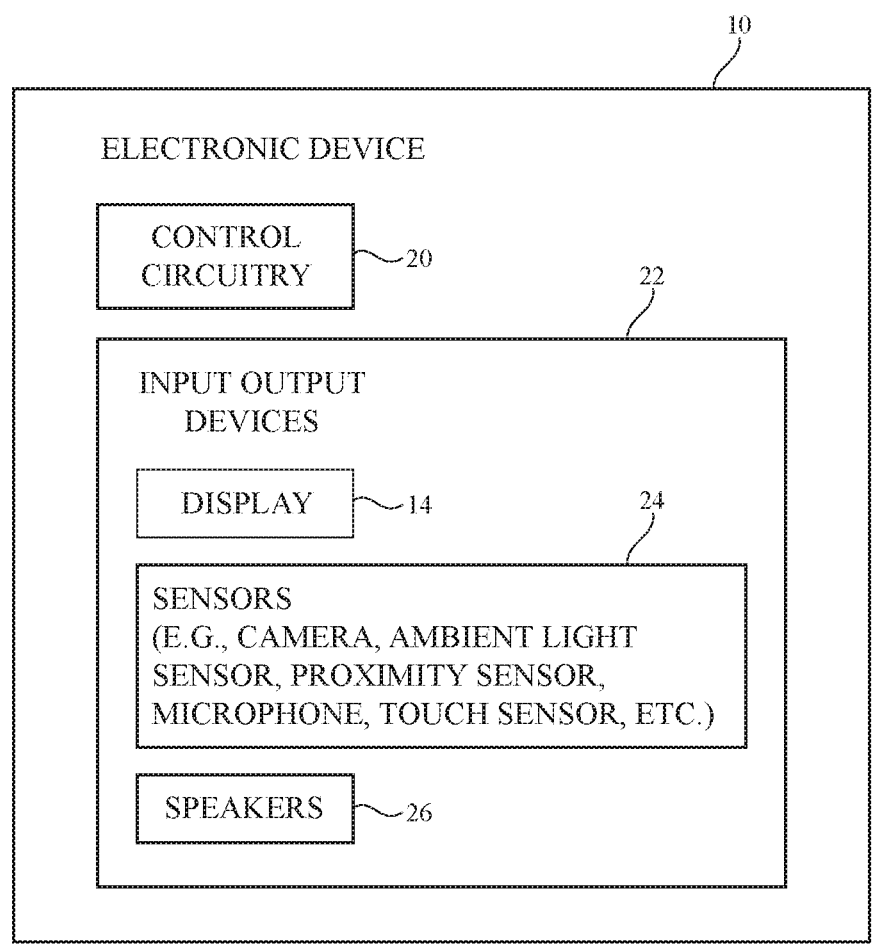
FIG. 1 is a schematic diagram of an illustrative electronic device in accordance with an embodiment.

An illustrative electronic device of the type that may be provided with a foldable display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. Illustrative configurations in which electronic device 10 is a portable electronic device such as a cellular telephone or tablet computer may sometimes be described herein as an example. This is, however, merely illustrative. Electronic device 10 may be any suitable electronic equipment.

As shown in FIG. 1, electronic device 10 may have control circuitry 20. Control circuitry 20 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 20 may be used to control the operation of device 10. The processing circuitry may be based on one or more microprocessors, microcontrollers, digital signal processors, baseband processors, power management units, audio chips, application specific integrated circuits, etc.

Control circuitry 20 may include wired and/or wireless communications circuitry. The wireless communications circuitry of circuitry 20 may include one or more antennas and one or more radio-frequency transceiver circuits (e.g., a cellular telephone transceiver, a wireless local area network transceiver, etc.).

Input-output circuitry in device 10 such as input-output devices 22 may be used to allow data to be supplied to device 10 and to allow data to be provided from device 10 to external devices. Input-output devices 22 may include buttons, joysticks, scrolling wheels, key pads, keyboards, tone generators, haptic output devices such as vibrators, light-emitting diodes and other status indicators, data ports, etc. Input-output devices 22 may also include sensors 24. Audio output (sound) may be provided using one or more speakers such as speakers 26.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Sensors 18 may include touch sensors (e.g., capacitive touch sensors formed from arrays of capacitive touch sensor electrodes that overlap display 14 and/or that are formed elsewhere in device 10), microphones for gathering ambient noise measurements and voice commands, a magnetic sensor (e.g., a compass), an accelerometer, a gyroscope, a force sensor (e.g., a two-dimensional force sensor which may optionally overlap a touch sensor and/or display 14), a temperature sensor, a pressure sensor, a compass, etc. Sensors 18 may also include light-based sensors such as a light-based proximity sensor (e.g., an optical proximity sensor having an infrared light-emitting diode that emits light and having a corresponding infrared light detector for measuring the infrared light after the infrared light has reflected from an external object), an ambient light sensor (e.g., a color-sensitive ambient light sensor that can measure ambient light color and intensity), and a camera (e.g., a digital image sensor) for capturing images, and/or other image sensing and/or light-detecting devices. Devices 22 may also include light-emitting diodes (e.g., status indicator lights, a camera flash, etc.) and/or other light-emitting devices. Light-based (optical) components such as these (e.g., light-emitting device and/or light-based sensors) may be mounted under transparent window regions (e.g., a transparent window in a portion of display 14, a transparent window in a device housing, etc.).

Figure 2:
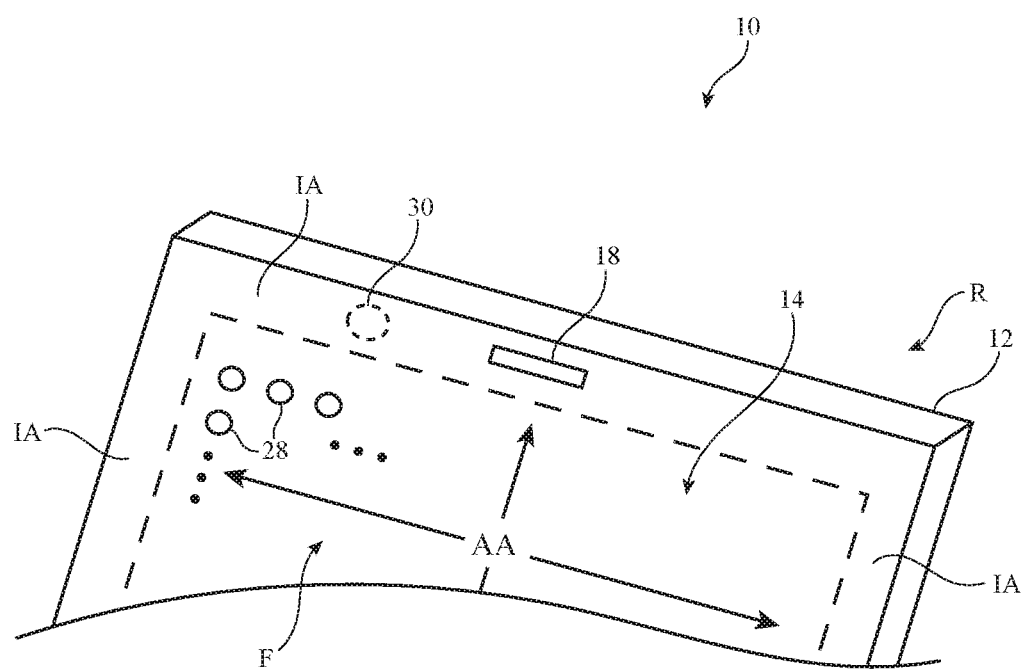
FIG. 2 is a perspective view of a portion of an electronic device with a display in accordance with an embodiment.

A perspective view of a portion of an illustrative electronic device is shown in FIG. 2. In the example of FIG. 2, device 10 includes a display such as display 14 mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). Portions of housing 12 may be formed from flexible materials (e.g., elastomeric materials such as silicone and/or other flexible polymers) and/or may include hinge structures (e.g., pivoting structures, single-bar or multibar linkages and/or other hinging mechanisms). Using these structures, housing 12 may bend about a bend axis (sometimes referred to as a bending axis, fold axis, folding axis, flex axis, etc.).

Openings may be formed in device 10. For example, an opening may be formed in display 14 to accommodate a button, a speaker port such as illustrative speaker port 18 of FIG. 2, or other components. Openings may be formed in housing 12 to form communications ports (e.g., an audio jack port, a digital data port, etc.), to form openings for buttons, openings for microphones and speakers, etc.

Display 14 may be a liquid crystal display, an electrophoretic display, an organic light-emitting diode display or other display with an array of light-emitting diodes, a plasma display, an electrowetting display, a display based on microelectromechanical systems (MEMs) pixels, or any other suitable display. Display 14 may have an array of pixels 28 in active area AA. Pixels 28 of active area AA may display images for a user of device 10. Active area AA may be rectangular or may have other suitable shapes. In some configurations, display 14 may have a flexible polymer substrate such as a polyimide substrate on which an array of pixel structures such as an array of organic light-emitting diodes and associated pixel circuits is formed. The flexible polymer substrate may facilitate bending.

Inactive border area IA may run along one or more edges of active area AA. Inactive border area IA may contain circuits, signal lines, and other structures that do not emit light for forming images. Masking structures (e.g., layers of black ink, etc.) may be used to hide inactive circuitry and other components in border area IA from view by a user of device 10.

Light-based components in device 10 (e.g., light-emitting diodes for status indicator lights and camera flashes, light-based sensors, and/or other optical components) may be overlapped by one or more windows such as window 30 of FIG. 2. Windows such as window 30 may be formed in a transparent portion of display 14, may be formed from a through-hole that passes through an array of pixels in display 14 (e.g., in an active area of display 14), and/or may be formed from transparent members of glass, sapphire, etc. that are mounted in housing 12 (e.g., in a rear housing wall of housing 12, etc.). In some configurations, thin layers of masking structures (e.g., thin black ink layers) may overlap optical windows that are otherwise transparent (e.g., to help obscure an optical component such as an ambient light sensor from view). In such configurations, light transmission may be reduced, but sufficient light is still passed to allow the optical window with the thin black ink coating to serve as an optical window for an optical component (e.g., an ambient light sensor in this example).

In some configurations, device 10 may have front and rear surfaces such as front surface F and rear surface R of FIG. 2. When device 10 is in an unfolded configuration, the front and rear surfaces may be lie in parallel planes on opposing sides of device 10. Display 14 may be mounted in housing 12 on front surface F, whereas a planar rear housing wall in housing 12 forms rear surface R. In a folded configuration, portions of front surface F may face each other while portions of rear surface R may face away from each other.

Figure 3:
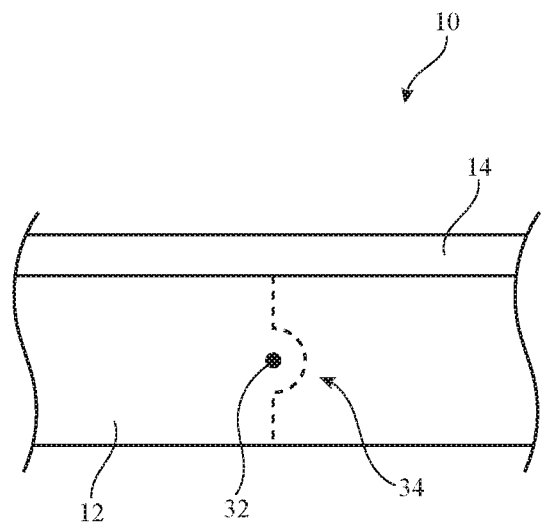
FIG. 3 is a cross-sectional side view of a portion of an illustrative electronic device with a hinge structure in accordance with an embodiment.
Figure 4:
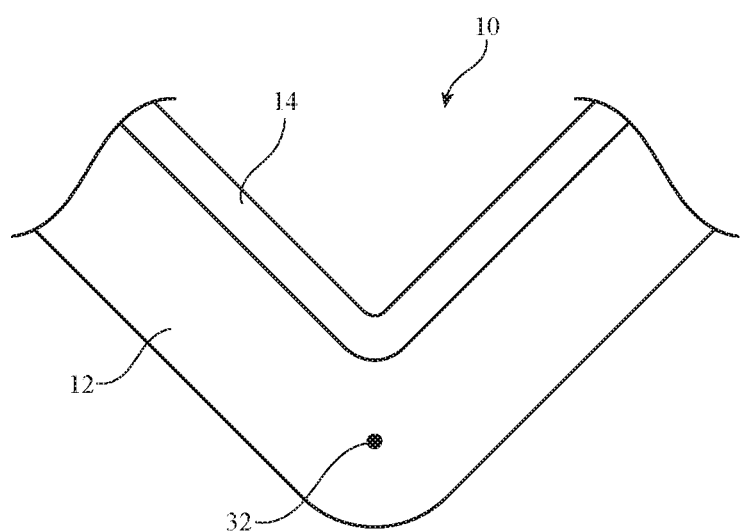
FIG. 4 is a cross-sectional side view of the portion of the electronic device of FIG. 3 in a partially folded configuration in accordance with an embodiment.

FIG. 3 is a cross-sectional side view of a portion of device 10 showing how display 14 may overlap a hinge structure in housing 12 such as hinge structure 34. Hinge structure 34 runs along bend axis 32 and allows device 10 to bend about bend axis 32, as shown in FIG. 4. Device 10 may, as an example, bend by 180° so that portions of housing 12 fold back on themselves. Hinge structure (hinge) 34 may be configured to support other amounts of bending (e.g., more or less than 180° about axis 32), if desired. Hinge structure 34 may include rotating interlocking structures, may include multi-element linkages, may include flexible sheets of material that flex about axis 32 and therefore serve as hinge structures, may include accordioned and/or selectively thinned layers of material that promote flexing, and/or may include other suitable hinge structures that support rotation of portions of device 10 about axis 32.

Figure 5:
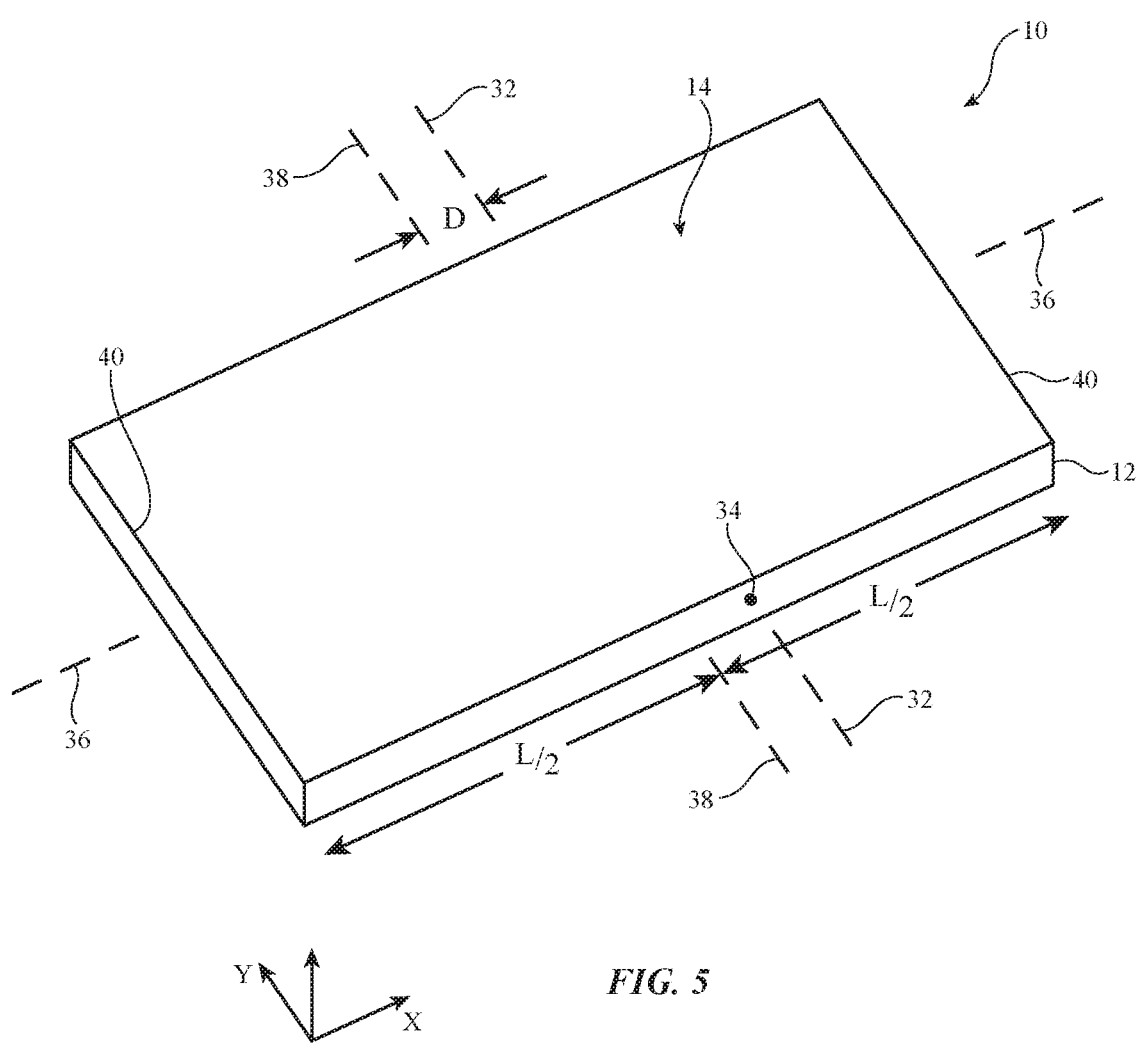
FIG. 5 is a perspective view of an illustrative unfolded electronic device in accordance with an embodiment.
Figure 6:
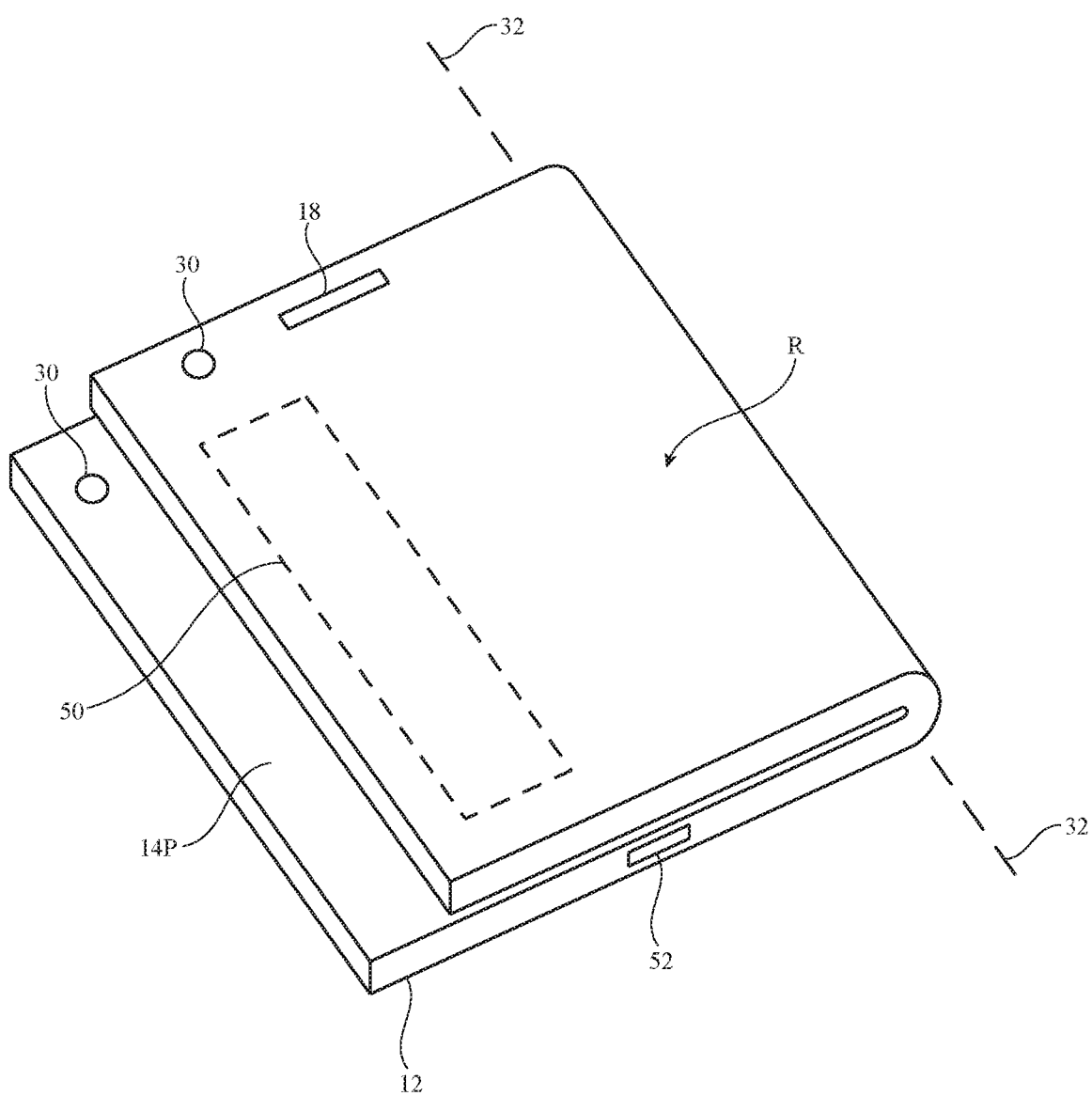
FIG. 6 is a perspective view of the illustrative electronic device of FIG. 5 in a folded configuration in accordance with an embodiment.

Portions of display 14 may become hidden from view as device 10 is folded (e.g., when first and second halves or other portions of housing 12 rotate until they are adjacent to each other and overlap each other). Other portions of display 14 may be configured to remain exposed when device 10 is folded. This type of arrangement is shown in FIGS. 5 and 6. As shown in FIG. 5, device 10 may be characterized by a center axis (axis of symmetry) such as axis 38. In the example of FIG. 5, center axis 38 runs along lateral dimension Y perpendicular to longitudinal axis 36 of device 10. Device 10 and housing 12 have a length L along axis 36. Center axis 38 is located at equal distances L/2 with respect to edges 40 of housing 12 and display 14. To create a region of display 14 that is unexposed when device 10 is folded, bend axis 32 and hinge structure 34 may be laterally offset (in lateral dimension X in this example) by a non-zero distance D with respect to center axis 38. As shown in FIG. 6, when device 10 is folded (e.g., by folding housing 12 and display 14 back on themselves 180° about bend axis 32 so that the folded portions of housing 12 are adjacent to each other), protruding display portion 14P of display 14 will be exposed and not covered by other portions of display 14 and housing 12. The surface of protruding display portion 14P may be co-planar with other portions of display 14 (e.g., portion 14P may lie in a common plane with front surface F and the portions of display 14 on front surface F when device 10 is unfolded).

Protruding display portion 14P (sometimes referred to as an uncovered display region, protruding display region, uncoverable display region, exposed display edge, uncovered persistently exposed display area, etc.) may be used to display any suitable content. As an example, notifications of incoming messages (emails, text messages, etc.), calendar content (e.g., meeting reminders), alerts (e.g., alarms, location-based alerts, etc.), battery status, wireless signal strength, airplane mode status, and other status information may be displayed on protruding display portion 14P by control circuitry 20. The uncovered persistently exposed display area may also be used by control circuitry 20 to display icons (e.g., icons associated with default applications and/or a set of frequently used and/or user-defined applications) and/or other content. The content that is displayed may be interactive (e.g., the content may include selectable on-screen items such as selectable icons, selectable buttons, selectable menu options, and/or other selectable content). Selectable content may be selected by supplying user input to select a displayed item (e.g., with an overlapping touch sensor and/or force sensor and/or with nearby touch sensors, force sensors, buttons, etc.).

To accommodate speakers such as speaker 26 (FIG. 1), a speaker port such as speaker port 18 may be formed on rear surface R of housing 12 (e.g., so that protruding display region 14R and speaker port 18 face in the same direction when device 10 is in the folded configuration of FIG. 6). Device 10 may include one or more optical windows 30 for light-based components and these windows may be formed in region 14P and/or other portions of device such as in a portion of the rear wall for housing 12 that is on rear surface R. If desired, touch sensors (e.g., a two-dimensional touch sensor), buttons, or other input-output devices 22 may be formed in a region such as region 50 on rear surface R of housing 12 (e.g., so that a user may supply input to one of these regions in response to adjacent content being displayed on protruding portion 14P). Audio port 52 may be formed in a sidewall of housing 12 (e.g., along the lower edge of housing 12) and may include a speaker (speakers 26 of FIG. 1) and/or a microphone (e.g., a microphone for use in capturing a user's voice during a voice command or telephone call).

Figure 7:
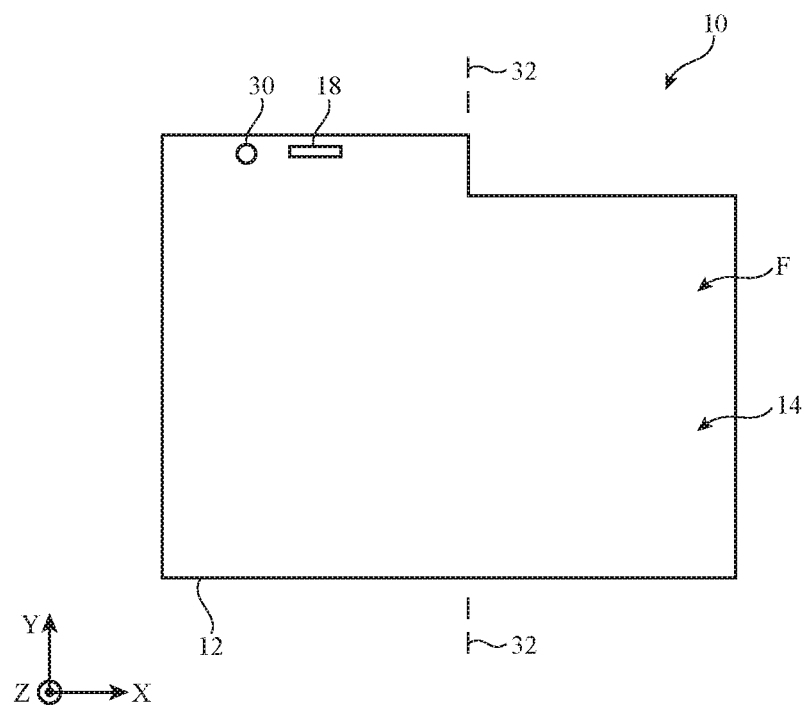
FIG. 7 is a front view of an illustrative unfolded electronic device in accordance with an embodiment.

In the example of FIGS. 5 and 6, protruding display portion 14P extends from the left edge of display 14 as viewed by a user facing front surface F of device 10. If desired, protruding display portion 14P may protrude from the right edge or other portions of display 14. As shown in FIG. 7, for example, protruding display portion 14P may protrude outwardly (in the X-Y plane in which display 14 lies) from the upper edge of display 14. As described in connection with FIG. 6, windows such as window 30 may overlap light-based components (e.g., a camera, camera flash, light-based proximity sensor, ambient light sensor, etc.). Speaker port opening 18 may be used to accommodate a speaker (e.g., an ear speaker for a user to use during cellular telephone calls with device 10).

Figure 8:
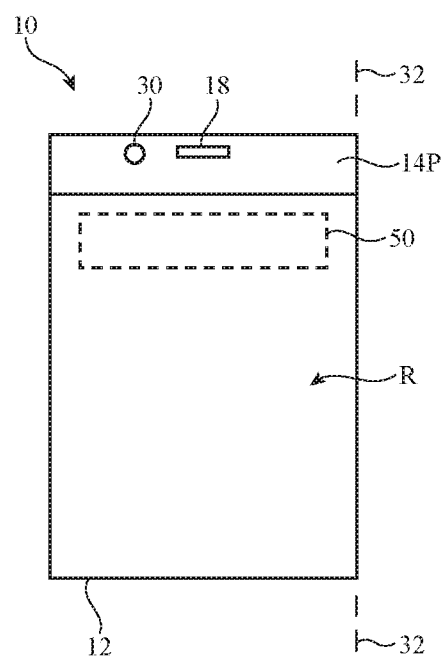
FIG. 8 is a front view of the electronic device of FIG. 7 in a folded configuration in accordance with an embodiment.

When device 10 of FIG. 7 is placed in a folded configuration as shown in FIG. 8, opening 18 and windows such as window 30 on protruding portion 14P will remain uncovered by display 14 and housing 12. This allows the user of device 10 to use speaker port 18 during telephone calls and allows optical components (e.g., an ambient light sensor, light-based proximity sensor, camera, and/or other optical components overlapped by portion 14P) to be used without unfolding device 10.

Figure 9:
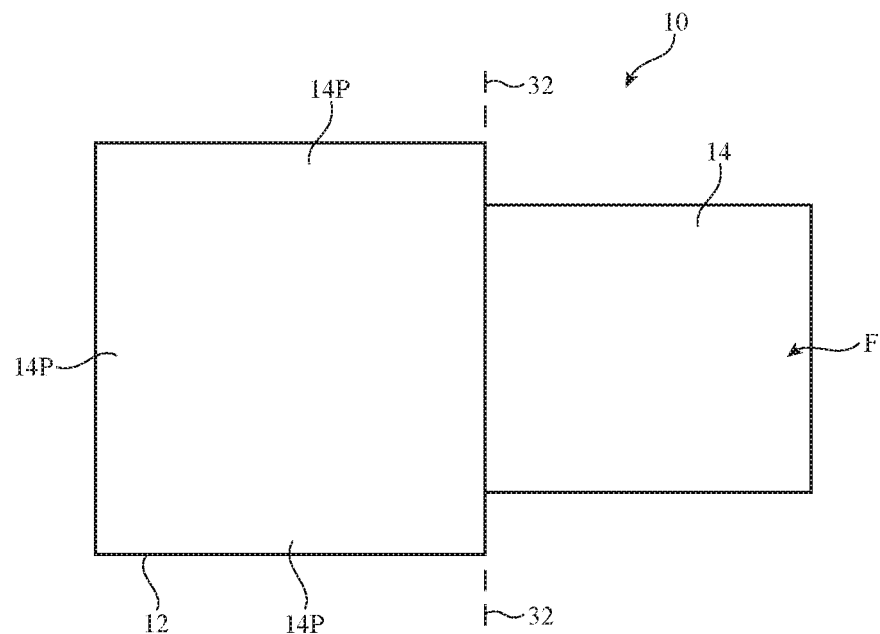
FIG. 9 is a front view of an illustrative unfolded electronic device in accordance with an embodiment.
Figure 10:
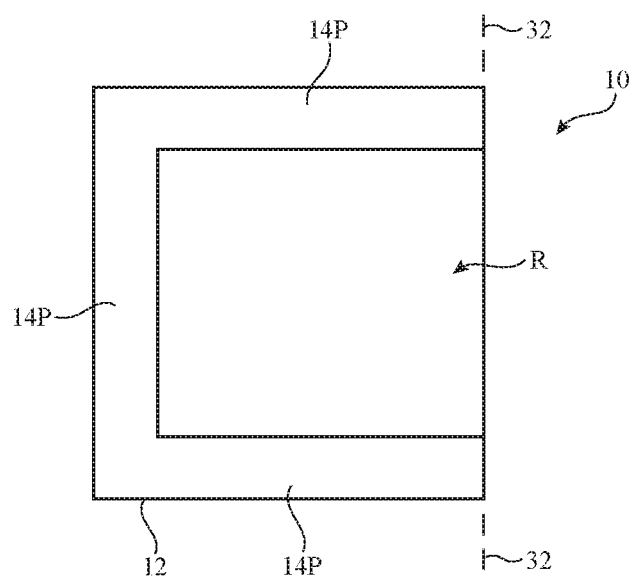
FIG. 10 is a front view of the electronic device of FIG. 9 in a folded configuration in accordance with an embodiment.

Protruding portion 14P of FIGS. 7 and 8 forms a strip-shaped display area that runs along a peripheral edge of display 14 perpendicular to bend axis 32, whereas protruding portion 14P of FIGS. 5 and 6 forms a strip-shaped display area that runs along a peripheral edge of display 14 parallel to bend axis 32. As shown in the illustrative configuration of FIG. 9, display 14 may have portions 14P that protrude from multiple edges of device 10 such as along the upper, left, and lower edges of the left half of display 14. As shown in FIG. 10, these portions 14P will remain uncovered by display 14 and housing 12 when device 10 is placed in a folded configuration.

Figure 11:
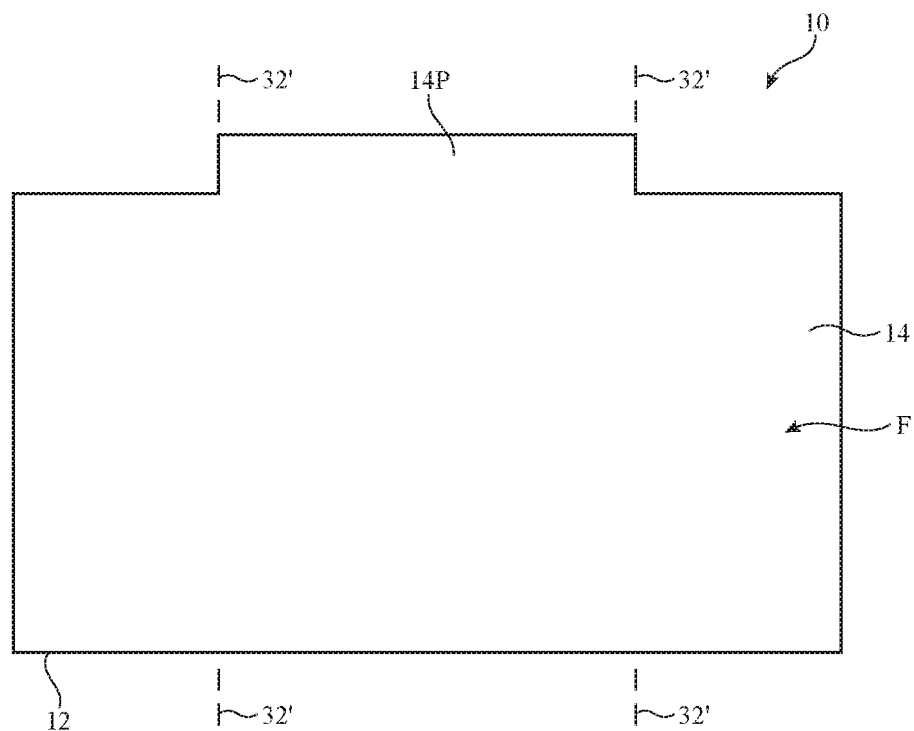
FIG. 11 is a front view of an illustrative unfolded electronic device in accordance with an embodiment.
Figure 12:
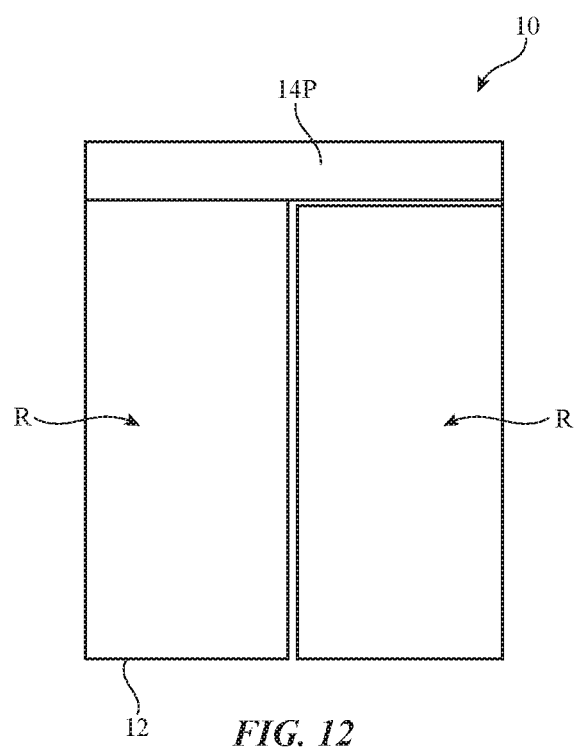
FIG. 12 is a front view of the electronic device of FIG. 11 in a folded configuration in accordance with an embodiment.

In the example of FIGS. 11 and 12, device 10 has a tri-fold configuration in which housing 12 and display 14 are bent about two parallel bend axes 32'. As shown in FIG. 11, display 14 may have a protruding portion such as protruding portion 14P that protrudes upwardly from the center of the upper edge of display 14. As shown in FIG. 12, protruding portion 14P remains uncovered by housing 12 and display 14 when the left and right portions of housing 12 are folded on top of the central portion of display 14.

Figure 13:
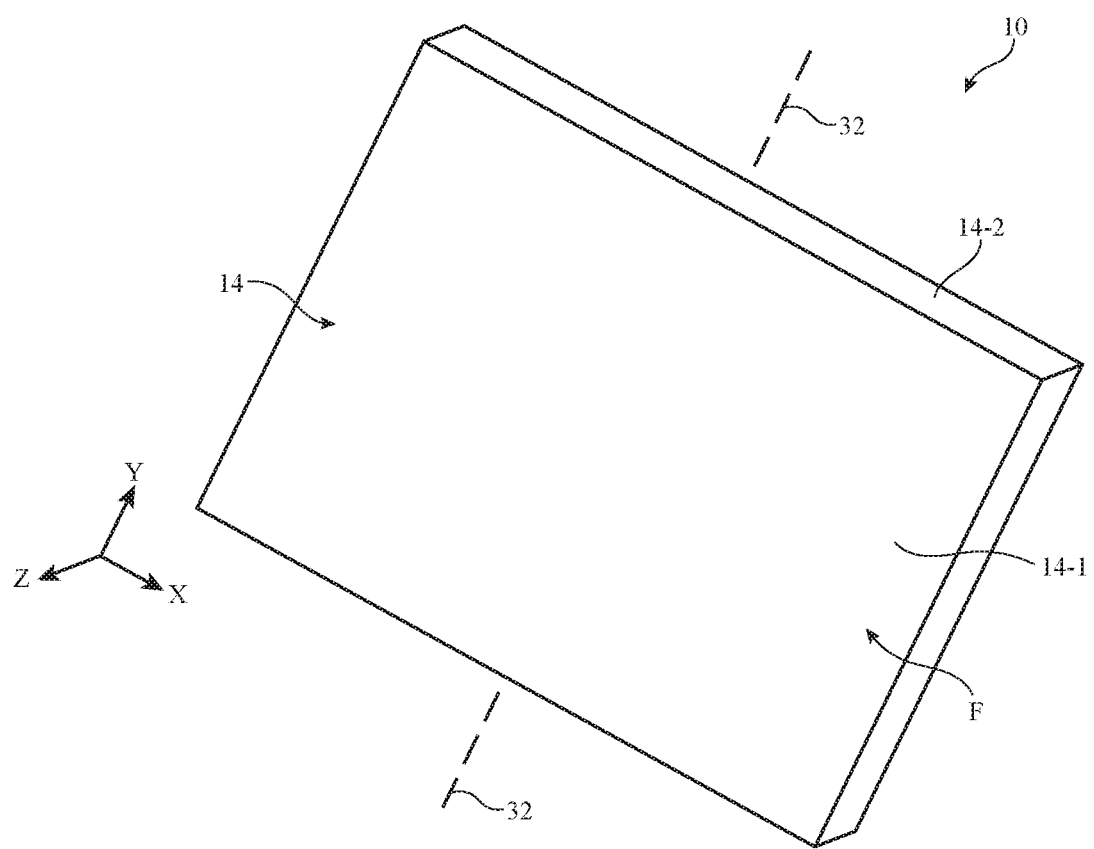
FIG. 13 is a perspective view of an illustrative unfolded electronic device with a display that extends over a sidewall of the device in accordance with an embodiment.
Figure 14:
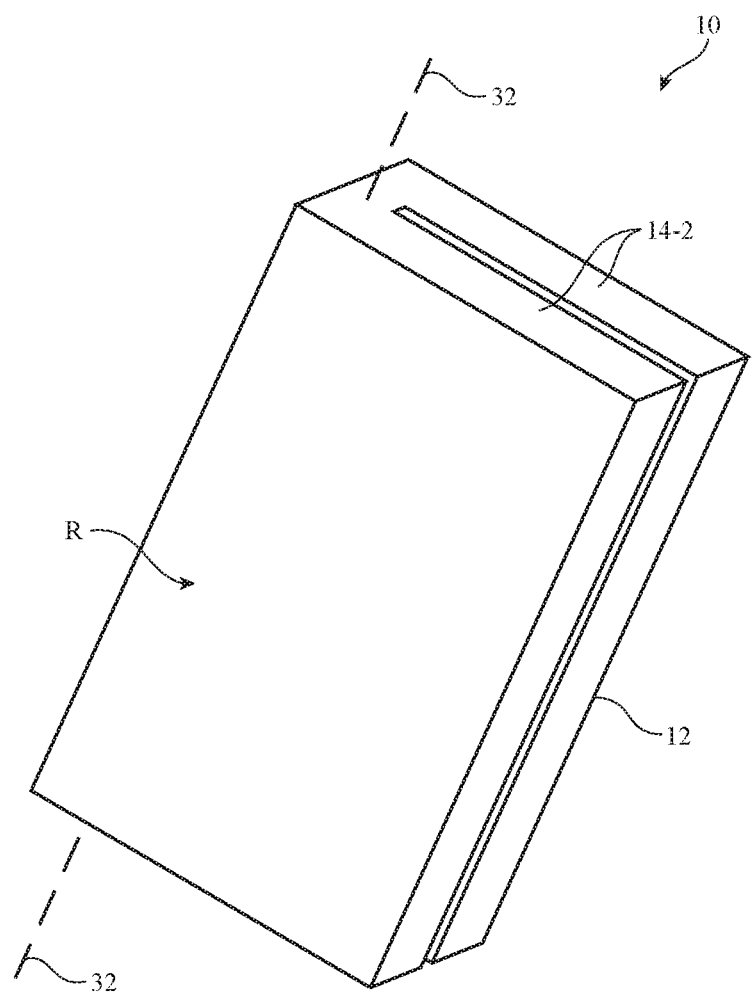
FIG. 14 is a perspective view of the illustrative electronic device of FIG. 13 in a folded configuration in accordance with an embodiment.

Another illustrative configuration is shown in FIGS. 13 and 14. In this arrangement, display 14 (e.g., a flexible display such as an organic light-emitting diode display, etc.) may have a first portion 14-1 (e.g., a main rectangular planar portion for displaying images during normal operation) on front surface F of device 10 and a second portion 14-2 on at least one sidewall of device 10 (FIG. 13). Portions 14-1 and 14-2 may be integral portions of a common display (e.g., portions 14-1 and 14-2 may be formed from a single array of pixels on a single common flexible substrate that is bent along edge 60 and folded down along the upper edge of housing 12, so that portion 14-2 is supported by the sidewall of housing 12 that lies along the upper edge of device 10). During operation of device 10 in the unfolded configuration of FIG. 13, content may be displayed for a user on main display portion 14-2 on front surface F of device 10 and may optionally be displayed for the user on smaller sidewall portion 14-2. During operation of device 10 in the folded configuration, display portion 14-1 is hidden from view, but display portion 14-2 can still be used to display content for a user (e.g., content of the type displayed on protruding portion 14P of FIGS. 5-12 such as notifications, icons, etc.). As with the arrangements of FIG. 5, a portion of display 14 remains in view in the configuration of FIG. 14, even as device 10 is placed in the folded configuration.

Figure 15:
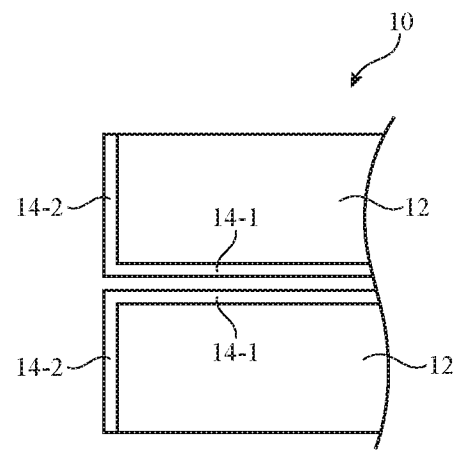
FIGS. 15, 16, and 17 are cross-sectional side views of end portions of illustrative electronic devices in accordance with embodiments.
Figure 16:
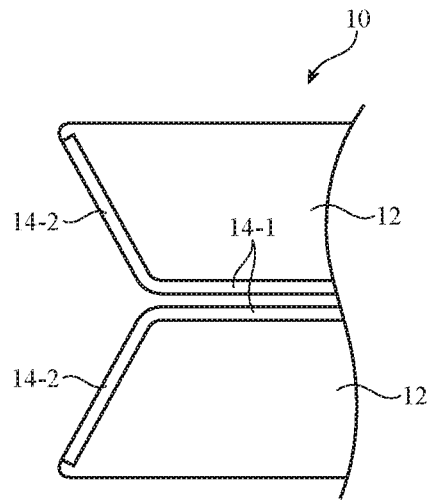
Figure 17:
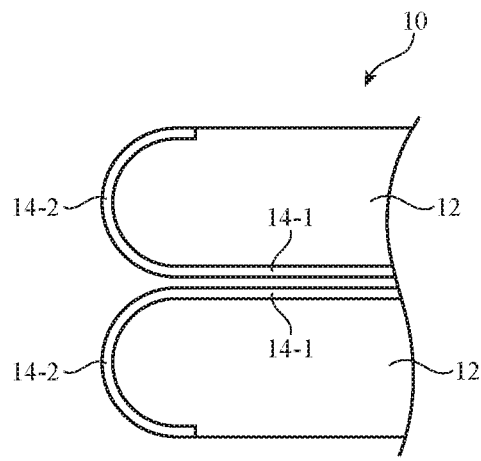

FIGS. 15, 16, and 17 are cross-sectional side views of illustrative edge portions of device 10. As shown in FIG. 15, housing 12 may have vertical sidewalls that support portions 14-2 of display 14. FIG. 16 shows how the sidewalls of housing 12 may be tapered. In the example of FIG. 17, the sidewalls of housing 12 have a curved cross-sectional profile (e.g., the sidewalls are rounded).

Figure 18:
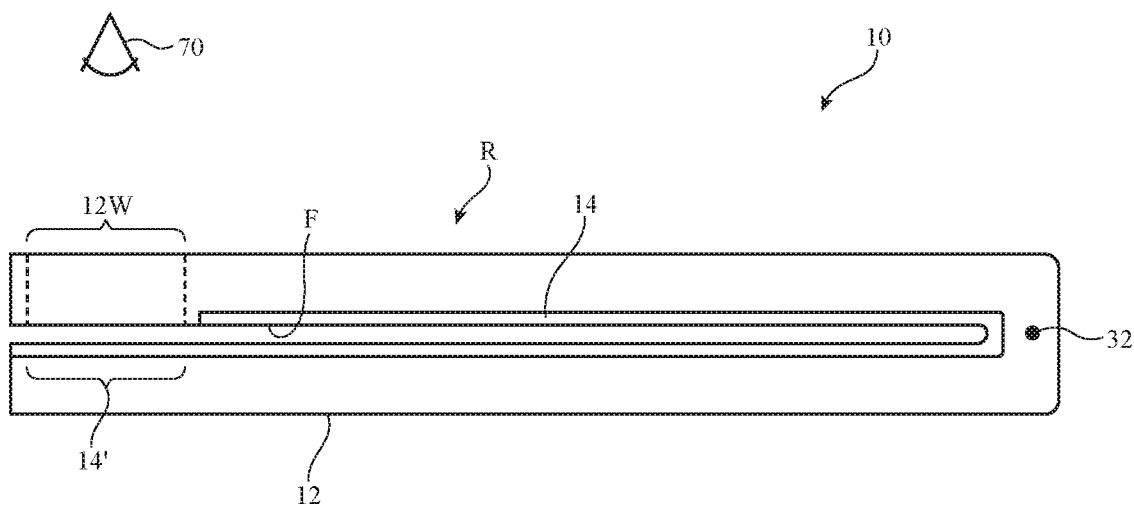
FIG. 18 is a cross-sectional side view of an illustrative electronic device with a window in a folded configuration that allows a portion of a display to be viewed through the window in accordance with an embodiment.

FIG. 18 is a cross-sectional side view of device 10 in an illustrative configuration in which device 10 has a transparent window in housing 12. As shown in FIG. 18, window 12W may pass through housing 12 from a portion of rear surface R to a portion of front surface F. This allows portion 14' of display 14 to be viewed by user 70, even when device 10 is in its folded configuration as shown in FIG. 18. Window 12W may be form clear polymer structures, transparent glass structures, air-filled opening(s), and/or other transparent structures.

Figure 19:
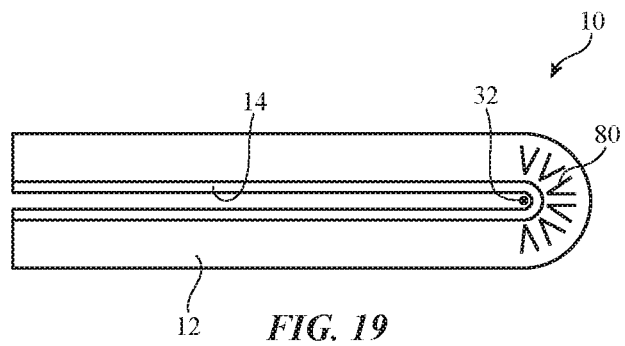
FIG. 19 is a cross-sectional side view of an illustrative electronic device in a folded configuration in accordance with an embodiment.
Figure 20:
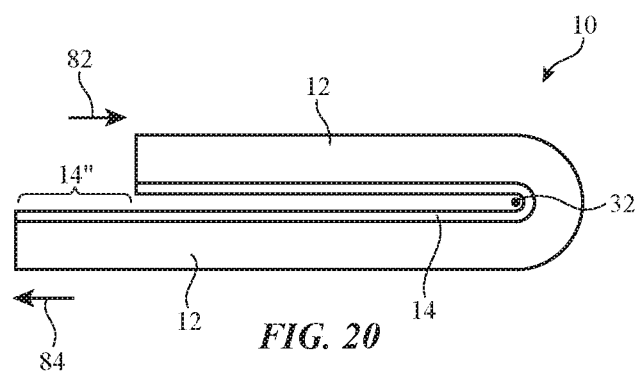
FIG. 20 is a cross-sectional side view of the electronic device of FIG. 19 in a configuration in which housing portions have been slid past each other to reveal an edge region of a display in accordance with an embodiment.

Illustrative device 10 of FIG. 19 has flexible structures 80 (e.g., air gaps, elastomeric structures, etc.) that allows device housing 12 to flex sufficiently to slide around bend axis 32. As shown in FIG. 20, edge portion 14" of display 14 may be selectively exposed (not covered by housing 12) by pushing a first part of housing 12 (e.g., the lower part in the example of FIG. 20) in direction 84 while pushing a second part of housing 12 (e.g., the upper part in the example of FIG. 20) in opposing direction 82.

Figure 21:
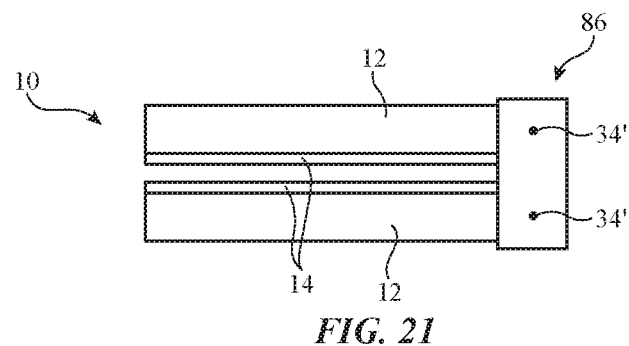
FIG. 21 is a cross-sectional side view of an illustrative electronic device in a folded configuration in accordance with an embodiment.
Figure 22:
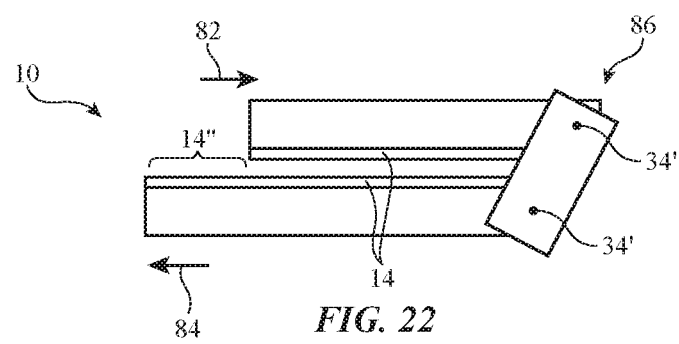
FIG. 22 is a cross-sectional side view of the electronic device of FIG. 21 in a configuration in which housing portions have been slid past each other to reveal an edge region of a display in accordance with an embodiment.

In the example of FIGS. 21 and 22, device 10 has another slide-to-expose configuration based on linkage 86 and associated hinge structures 34'.

Figure 23:
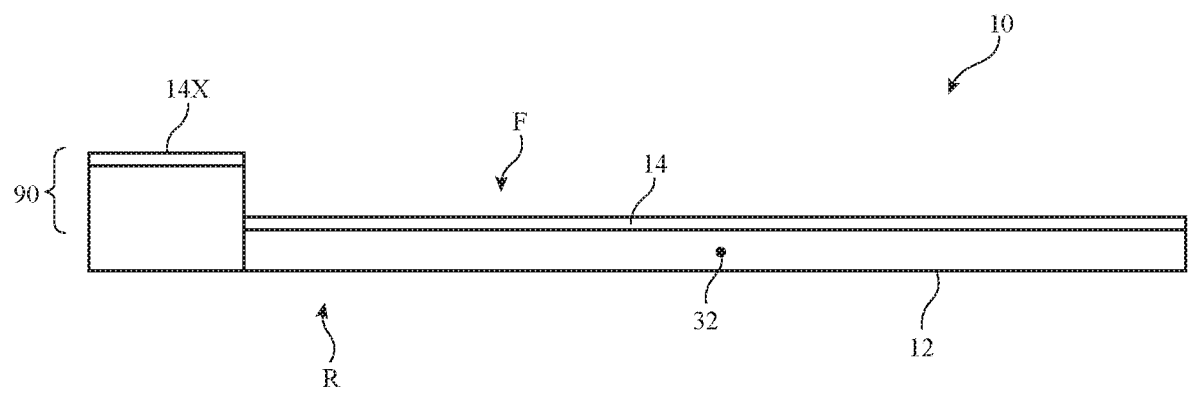
FIG. 23 is a cross-sectional side view of an illustrative electronic device in accordance with an embodiment.
Figure 24:
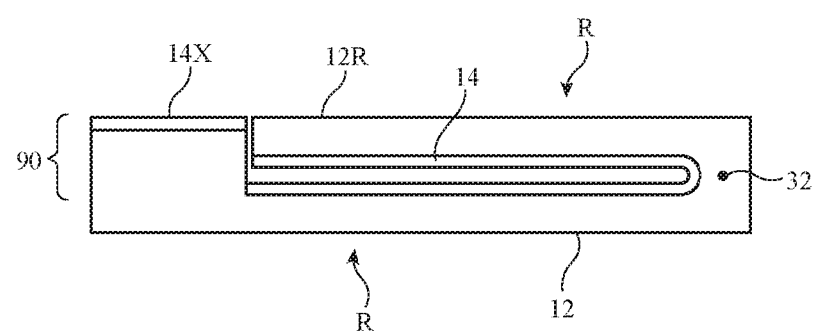
FIG. 24 is a cross-sectional side view of the electronic device of FIG. 23 in a folded configuration in accordance with an embodiment.

FIGS. 23 and 24 are cross-sectional side views of device 10 in an illustrative configuration in which housing 12 has a protruding portion such as portion 90 that is thicker than other portions of housing 12 in the unfolded configuration. As shown in FIG. 23, in the unfolded configuration, display 14 may be used to display images on front surface F of device 10. Device 10 may have a display such as display 14X that serves as a supplemental display for displaying content of the type described in connection with protruding display portion 14P and/or other suitable content. When device 10 is placed in the folded (closed) position of FIG. 24, rear surface 12R of the portion of housing 12 that is folded over display 14 may lie flush with display 14X.

Figure 25:
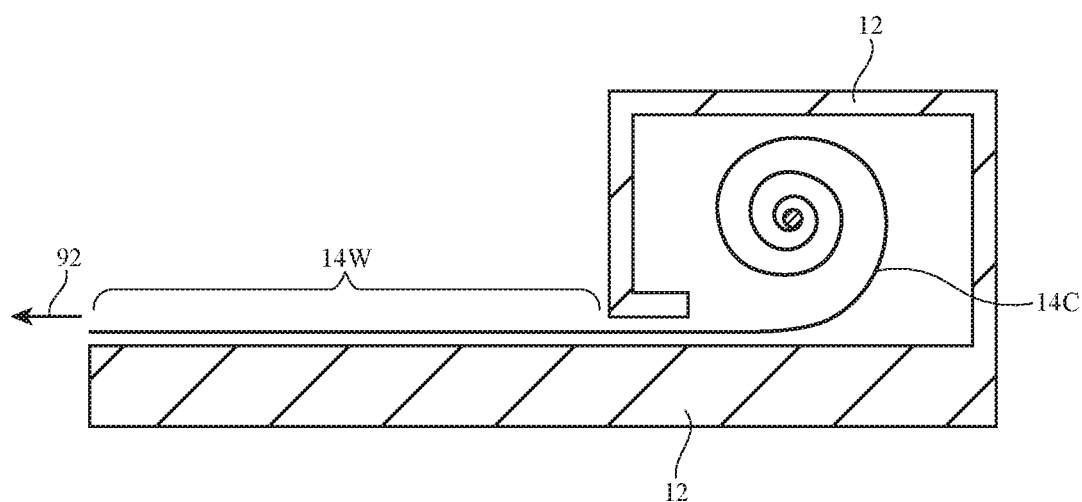
FIG. 25 is a cross-sectional side view of an illustrative electronic device with a scrolling display in accordance with an embodiment.

Device 10 may, if desired, have a scrolling flexible display such as display 14C of FIG. 25 that is mounted in an interior portion of housing 12. When it is desired to use display 14 during normal use to view video, read books, etc., display 14 can be unscrolled in its entirely by withdrawing all or most of display 14 from housing 12 (e.g., by pulling on the end of display 14 in direction 92). When it is desired to stow display 14 for travel, but it is still desired to receive notifications and other information (see, e.g., the content displayed on protruding portion 14P), a strip-shaped edge portion 14W of display 14 can be configured to protrude out of housing 12 as shown in FIG. 25. Notifications and other content can be displayed on portion 14W.

The foregoing is merely illustrative and various modifications can be made to the described embodiments. The foregoing embodiments may be implemented individually or in any combination.

What is claimed is:

1. An electronic device, comprising:
    a housing having first and second housing portions that rotate with respect to each other about a single fixed bend axis; and
    a flexible display in the housing that overlaps the single fixed bend axis, wherein the flexible display has a first display portion that is covered when the housing is folded along the single fixed bend axis and has a second display portion that protrudes from the first display portion and that is not covered when the housing is folded along the single fixed bend axis and the first and second housing portions are overlapping and adjacent to each other, and wherein the flexible display is only foldable along the single fixed bend axis such that the second display portion is always exposed.

2. The electronic device defined in claim 1 further comprising:
    control circuitry configured to display notifications and icons on the second portion when the housing is folded along the single fixed bend axis.

3. The electronic device defined in claim 1 further comprising touch sensors on a portion of the housing, wherein the touch sensors are adjacent to the second display portion when the housing is folded along the single fixed bend axis.

4. The electronic device defined in claim 1 further comprising:
a speaker, wherein the housing has a surface with an opening for the speaker and wherein the opening and the second display portion face in a common direction when the housing is folded along the single fixed bend axis.

5. The electronic device defined in claim 1 further comprising:
an optical component in the second display portion.

6. The electronic device defined in claim 1 wherein the optical component comprises a component selected from the group consisting of: a camera, an optical proximity sensor, and an ambient light sensor.

7. The electronic device defined in claim 1 wherein the protruding portion is a strip-shaped display portion that runs parallel to the single fixed bend axis.

8. The electronic device defined in claim 1 wherein the protruding portion is a strip-shaped display portion that runs perpendicular to the single fixed bend axis.

9. An electronic device, comprising:
a housing having first and second housing portions that rotate with respect to each other about a bend axis; and
a flexible display in the housing that overlaps the bend axis, wherein the flexible display has a first display portion that is covered when the housing is folded along the bend axis and has a second display portion that protrudes from the first display portion and that is not covered when the housing is folded along the bend axis and the first and second housing portions are overlapping and adjacent to each other, and wherein the second display portion extends along at least three edges of the housing.

10. An electronic device, comprising:
a housing having portions defining a rear surface and a sidewall surface;
a flexible display coupled to the housing and having a first portion and a second portion, wherein the housing and the flexible display are configured to bend about a bend axis, wherein the second portion is on the sidewall surface, and wherein:
when the housing is in an unfolded configuration and is not bent about the bend axis, the first portion lies in a plane parallel to the rear surface and is visible; and
when the housing is in a folded configuration and is bent about the bend axis, the first portion is hidden from view and the second portion is visible on an end of the housing.

11. The electronic device defined in claim 10 further comprising:
control circuitry configured to display at least one of: a notification and an icon on the second portion.

12. The electronic device defined in claim 11 wherein the sidewall surface has a curved cross-sectional profile.

13. The electronic device defined in claim 11 wherein the sidewall surface has a planar cross-sectional profile.

14. An electronic device, comprising:
a foldable housing that bends about a bend axis between an unfolded configuration and a folded configuration;
a flexible display coupled to the foldable housing and having first and second portions, wherein the flexible display has an active area with an array of pixels configured to display images, wherein the bend axis overlaps an edge of the second portion and wherein:
when the foldable housing is in the unfolded configuration, the first portion and the second portion lie flat in a common plane and display an image; and
when the foldable housing is in the folded configuration, the first portion is hidden from view and the second portion protrudes from the housing and is exposed and viewable.

15. The electronic device defined in claim 14 wherein the second portion has an additional edge that is parallel to the edge and wherein the additional edge runs parallel to the bend axis.

16. The electronic device defined in claim 15 wherein the housing has a speaker port and wherein the speaker port and the second portion face in a common direction when the foldable housing is in the folded configuration.

17. The electronic device defined in claim 14 wherein the second portion has an additional edge that is perpendicular to the edge and wherein the additional edge runs perpendicular to the bend axis.

18. The electronic device defined in claim 17 further comprising a camera in the second portion.

19. The electronic device defined in claim 18 further comprising an ambient light sensor in the second portion.

* * * * *